US011351887B2

(12) United States Patent
Furukawa et al.

(10) Patent No.: US 11,351,887 B2
(45) Date of Patent: Jun. 7, 2022

(54) MANAGEMENT DEVICE AND POWER SUPPLY SYSTEM

(71) Applicant: SANYO Electric Co., Ltd., Daito (JP)

(72) Inventors: Kimihiko Furukawa, Hyogo (JP); Masato Nishikawa, Hyogo (JP); Kenji Motoyoshi, Hyogo (JP); Noriharu Kobayashi, Hyogo (JP); Yoshitaka Sakiyama, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 53 days.

(21) Appl. No.: 16/954,361

(22) PCT Filed: Nov. 15, 2018

(86) PCT No.: PCT/JP2018/042206
§ 371 (c)(1),
(2) Date: Jun. 16, 2020

(87) PCT Pub. No.: WO2019/123907
PCT Pub. Date: Jun. 27, 2019

(65) Prior Publication Data
US 2021/0086661 A1 Mar. 25, 2021

(30) Foreign Application Priority Data
Dec. 22, 2017 (JP) ............................. JP2017-246786

(51) Int. Cl.
*B60L 58/22* (2019.01)
*G01R 31/388* (2019.01)
*B60L 58/12* (2019.01)
*H02J 7/00* (2006.01)
*H01M 10/42* (2006.01)
(Continued)

(52) U.S. Cl.
CPC ............... *B60L 58/22* (2019.02); *B60L 58/12* (2019.02); *G01R 31/388* (2019.01);
(Continued)

(58) Field of Classification Search
CPC ....... B60L 58/22; B60L 58/12; G01R 31/388; G01R 31/396; H02J 7/007182;
(Continued)

(56) References Cited

U.S. PATENT DOCUMENTS 7,564,217 B2 * 7/2009 Tanigawa ............... H02J 7/0026
320/118
8,648,570 B2 * 2/2014 Lim ....................... H02J 7/0014
320/118
(Continued)

FOREIGN PATENT DOCUMENTS

| CN | 103078356 A | * | 5/2013 | ............ H01M 10/44 |
| EP | 3337002 A1 | * | 6/2018 | ............ H01M 10/441 |

(Continued)

OTHER PUBLICATIONS

International Search Report dated Dec. 25, 2018, issued in counterpart application No. PCT/JP2018/042206, with English translation. (4 pages).

*Primary Examiner* — M Baye Diao
(74) *Attorney, Agent, or Firm* — WHDA, LLP

(57) ABSTRACT

Provided is a management device that manages a power storage module configured by connecting in series a plurality of parallel cell groups in which a plurality of cells are connected in parallel. In the management device, a voltage detection circuit detects a voltage of each of the plurality of parallel cell groups connected in series. A plurality of equalizing circuits are connected in parallel to the plurality of parallel cell groups, respectively. A controlling circuit controls the plurality of equalizing circuits based on the voltage detected by the voltage detection circuit and executes an equalizing process. The controlling circuit determines whether or not an abnormal cell is included in each of the parallel cell groups based on a voltage change of each of
(Continued)

the parallel cell groups during discharging to the equalizing circuit or charging from the equalizing circuit.

6 Claims, 12 Drawing Sheets

(51) Int. Cl.
*H01M 10/44* (2006.01)
*H01M 10/48* (2006.01)

(52) U.S. Cl.
CPC ....... *H01M 10/425* (2013.01); *H01M 10/441* (2013.01); *H01M 10/482* (2013.01); *H02J 7/0014* (2013.01); *H02J 7/007182* (2020.01); *H01M 2010/4271* (2013.01)

(58) Field of Classification Search
CPC .... H02J 7/0014; H02J 2310/48; H02J 7/0048; H02J 1/06; H02J 7/0016; H01M 10/425; H01M 10/441; H01M 10/482; H01M 2010/4271; Y02T 10/70; Y02E 60/10
USPC .......................................... 320/118
See application file for complete search history.

(56) References Cited

U.S. PATENT DOCUMENTS

| | | | | |
|---|---|---|---|---|
| 9,005,788 | B2 * | 4/2015 | Zhu | H02J 7/0021 |
| | | | | 429/90 |
| 9,030,207 | B2 * | 5/2015 | Lasson | G01R 31/006 |
| | | | | 324/525 |
| 10,033,200 | B2 * | 7/2018 | Mai | B60L 58/22 |
| 2009/0066291 | A1 * | 3/2009 | Tien | H02J 7/0069 |
| | | | | 320/118 |
| 2010/0057385 | A1 | 3/2010 | Iida | |
| 2010/0225275 | A1 * | 9/2010 | Bucur | H02J 7/0019 |
| | | | | 320/116 |
| 2010/0277123 | A1 * | 11/2010 | Lim | H02J 7/0014 |
| | | | | 320/116 |
| 2011/0080139 | A1 * | 4/2011 | Troxel | H01M 10/488 |
| | | | | 320/134 |
| 2011/0148426 | A1 | 6/2011 | Yokotani | |
| 2013/0106356 | A1 * | 5/2013 | Nakao | B60L 58/21 |
| | | | | 320/118 |
| 2017/0072803 | A1 | 3/2017 | Murai et al. | |

FOREIGN PATENT DOCUMENTS

| | | | | | |
|---|---|---|---|---|---|
| EP | 2770606 | B1 * | 4/2019 | ............... | B60L 58/22 |
| JP | 2001174531 | A * | 6/2001 | ........... | G01R 31/396 |
| JP | 2008-134060 | A | 6/2008 | | |
| JP | 2009-257928 | A | 11/2009 | | |
| JP | 2011-135656 | A | 7/2011 | | |
| JP | 2013011596 | A * | 1/2013 | ........... | G01R 31/396 |
| JP | 2014-108028 | A | 6/2014 | | |
| JP | 2017-59358 | A | 3/2017 | | |
| JP | 6215220 | B2 * | 10/2017 | ........... | B60R 16/033 |
| WO | 2017/130258 | A1 | 8/2017 | | |

* cited by examiner

MANAGEMENT DEVICE AND POWER SUPPLY SYSTEM

TECHNICAL FIELD

The present invention relates to a management device that manages a state of a power storage module and a power supply system.

BACKGROUND ART

In recent years, hybrid vehicles (HV), plug-in hybrid vehicles (PHV), and electric vehicles (EV) are becoming popular. Secondary batteries are installed as key devices in these vehicles. As the on-board secondary batteries, nickel metal hydride batteries and lithium ion batteries are commonly used. In the future, the use of the lithium ion batteries having high energy density are expected to be further promoted.

As a power supply system that realizes high voltage and high capacity at the same time, a multiple series-parallel power storage module may be used (for example, see Patent Literature 1). The multiple series-parallel power storage module is configured by connecting in series a plurality of parallel cell groups formed by connecting plural cells in parallel. In the multiple series-parallel power storage module, an open failure may occur in some of the cells of the parallel cell groups, due to activation of a current interrupt device (CID) caused by increase in cell internal pressure, disconnection of input and output wiring of the cells, disconnection of input and output terminals (e.g., bus bar) of the cells, or the like. In that case, a capacity of the parallel cell group rapidly decreases.

The following two methods are conceivable as methods for detecting the open failure of the cells in the multiple series-parallel power storage module. The first method is a method of measuring an open circuit voltage (OCV) or a closed circuit voltage (CCV) of the plurality of parallel cell groups connected in series, and based on a voltage deviation between the plurality of parallel cell groups, detecting an abnormal parallel group. Note that the OCV is a voltage measured with no current flowing through the power storage module, and the CCV (=I·R+OCV) is a voltage measured with current flowing through the power storage module.

The second method is a method of detecting an abnormal parallel cell group based on a difference between an amount of power based on an integrated current value flowing in the parallel cell group and an amount of power estimated from the OCV of the parallel cell group.

CITATION LIST

Patent Literature

PTL 1: Unexamined Japanese Patent Publication No. 2011-135656

SUMMARY OF THE INVENTION

Technical Problems

In the first method described above, even if the open failure occurs in some of the cells of the parallel cell group, it takes time to detect an abnormality because resistance fluctuation of the parallel cell group is small. In the second method described above, current is required to be flowing through the power storage module, and therefore, a vehicle needs to be traveling for on-board use. During traveling, variation in current is large and a phase shift occurs easily. Therefore, detection accuracy becomes low. Further, because the abnormality of the parallel cell group cannot be detected unless the vehicle is traveling, the detection timing tends to be delayed, causing a risk that the vehicle suddenly stops due to a battery abnormality after the vehicle starts traveling. Therefore, the abnormality in the parallel cell group is preferably detected before traveling as much as possible.

The present invention has been made in view of such situations, and an object of the present invention is to provide a technique for detecting an abnormal parallel cell group in a multiple series-parallel power storage module with high accuracy in a short time.

Solution to Problems

In order to solve the above problems, a management device according to an aspect of the present invention manages a power storage module configured by connecting in series a plurality of parallel cell groups in which a plurality of cells are connected in parallel, the management device including: a voltage detection circuit that detects a voltage of each of the plurality of parallel cell groups connected in series; a plurality of equalizing circuits connected in parallel to the plurality of parallel cell groups, respectively; and a controlling circuit that controls the plurality of equalizing circuits based on the voltage detected by the voltage detection circuit and executes an equalizing process. The controlling circuit determines whether or not an abnormal cell is included in each of the plurality of parallel cell groups based on a voltage change of each of the plurality of parallel cell groups during discharging to each of the plurality of equalizing circuits or charging from each of the plurality of equalizing circuits.

It should be noted that any combination of the above configuration elements, and an expression of the present invention converted between methods, devices, systems, and the like are also effective as an aspect of the present invention.

Advantageous Effects of Invention

According to the present invention, an abnormal parallel cell group can be detected with high accuracy in a short time in a multiple series-parallel power storage module.

DESCRIPTION OF EMBODIMENT

Figure 1:
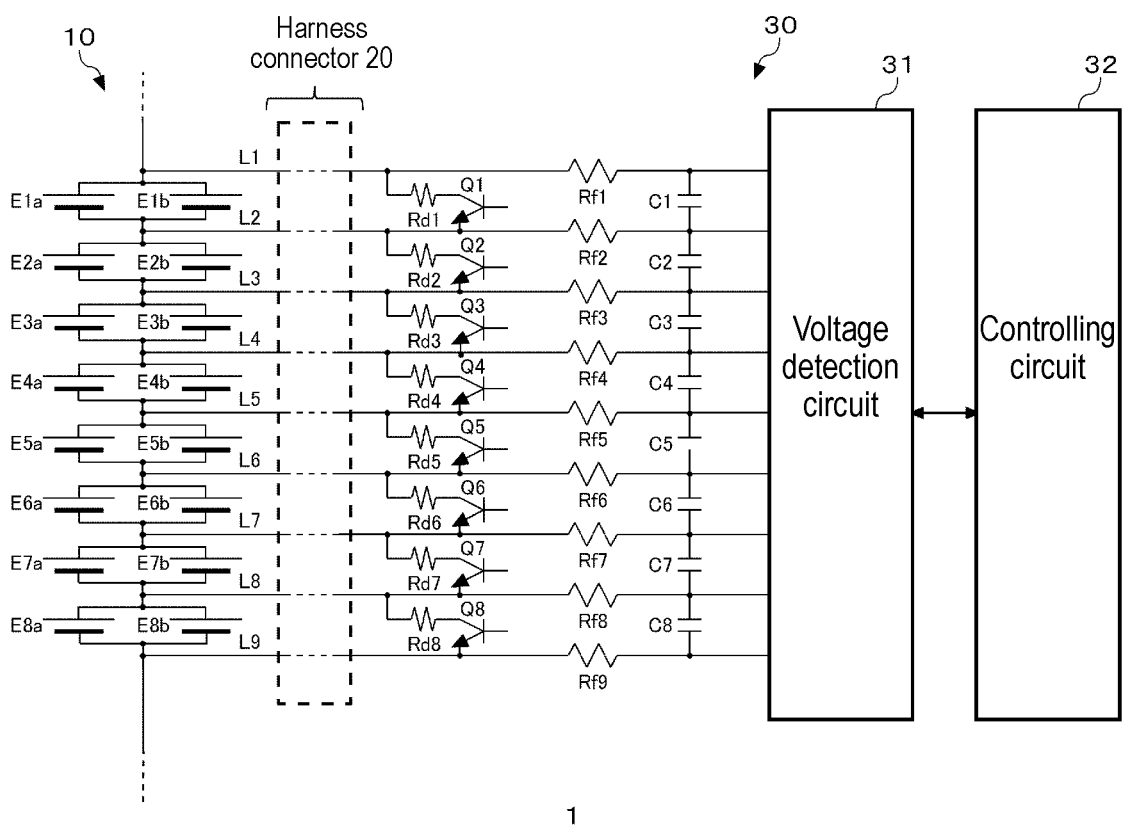
FIG. 1 is a diagram showing a power supply system according to an exemplary embodiment of the present invention.

FIG. 1 is a diagram showing power supply system 1 according to an exemplary embodiment of the present invention. Power supply system 1 includes power storage module 10 and management device 30. Power storage module 10 is configured by connecting in parallel a plurality of parallel cell groups in which a plurality of cells are connected in parallel. FIG. 1 shows an example of a two-parallel eight-series power storage module. A lithium ion battery cell, a nickel metal hydride battery cell, a lead battery cell, an electric double layer capacitor cell, a lithium ion capacitor cell, or the like can be used as each of the cells. Hereinafter, in the present description, an example using a lithium ion battery cell (nominal voltage: 3.6 V to 3.7 V) is assumed.

Management device 30 includes equalizing circuits, input filters, voltage detection circuit 31, and controlling circuit 32, which are mounted on a printed wiring board. Voltage detection circuit 31 is connected to each node of a plurality of parallel cell groups E1 to E8 connected in series with a plurality of voltage detection lines L1 to L9, and detects a voltage between two adjacent voltage detection lines to detect a voltage of each of parallel cell groups E1 to E8. Voltage detection circuit 31 is constituted of, for example, an application specific integrated circuit (ASIC) which is a dedicated custom IC. Voltage detection circuit 31 transmits the detected voltage of each of parallel cell groups E1 to E8 to controlling circuit 32. Because voltage detection circuit 31 is higher in voltage than controlling circuit 32, voltage detection circuit 31 and controlling circuit 32 are connected by a communication line in an insulated state.

A wire harness is connected to each node of the plurality of parallel cell groups E1 to E8 of power storage module 10, and a connector at a tip of each wire harness is attached to each connector of management device 30 mounted on the printed wiring board. That is, power storage module 10 and management device 30 are electrically connected via harness connector 20.

Resistors Rf1 to Rf9 are respectively inserted in the plurality of voltage detection lines L1 to L9, and capacitors C1 to C8 are connected between two adjacent voltage detection lines, respectively. Resistors Rf1 to Rf9 and capacitors C1 to C8 constitute the input filters (low-pass filters), and have a function of stabilizing a voltage that is input to voltage detection circuit 31.

Respective connectors of management device 30 and respective detection terminals of voltage detection circuit 31 are connected by a plurality of voltage detection lines L1 to L9. An equalizing circuit is connected between each pair of the two adjacent voltage detection lines. In the example shown in FIG. 1, the equalizing circuits are constituted of series circuits of discharge resistors Rd1 to Rd8 and discharge switches Q1 to Q8, respectively. Discharge switches Q1 to Q8 are constituted of, for example, transistors.

Although not shown in FIG. 1, a current sensor is installed for detecting a value of current flowing through the plurality of parallel cell groups E1 to E8. For example, a Hall element or a shunt resistor can be used for the current sensor. Further, at least one temperature sensor is installed for detecting a temperature of the plurality of parallel cell groups E1 to E8. For example, a thermistor can be used for the temperature sensor. Detection values of the current sensor and the temperature sensor are output to controlling circuit 32.

Controlling circuit 32 manages the plurality of parallel cell groups E1 to E8 based on voltage values of the plurality of parallel cell groups E1 to E8 obtained from voltage detection circuit 31, current values of the plurality of parallel cell groups E1 to E8 obtained from the current sensor, and temperature values of the plurality of parallel cells groups E1 to E8 obtained from the temperature sensor. Controlling circuit 32 estimates an SOC and a state of health (SOH) of the plurality of parallel cell groups E1 to E8. The SOC can be estimated by, for example, an OCV method or a current integration method.

The SOH is defined as a ratio of a full charge capacity at a present time to a full charge capacity at an initial time, and as a value of the ratio becomes lower (closer to 0%), degradation progresses more. The SOH can be estimated based on a correlation with internal resistance. The internal resistance can be estimated by dividing a voltage drop generated when predetermined current passes through a battery for a predetermined duration, by the current. The internal resistance is in a relationship of decreasing as the temperature rises and is in a relationship of increasing as the degradation of the battery progresses. The degradation of the battery progresses as charge and discharge frequencies increase. The degradation of the battery also depends on the individual differences and the usage environment. Therefore, as the usage time period becomes longer, variation in capacities of the plurality of parallel cell groups E1 to E8 basically becomes larger.

The capacities of the plurality of parallel cell groups E1 to E8 vary not only due to the degradation over time but also due to the factors of the usage environment at the present time. For example, when a difference in temperature occurs between the plurality of parallel cell groups E1 to E8 due to installed positions of the plurality of parallel cell groups E1 to E8, the capacities vary. On the other hand, controlling circuit 32 executes an equalizing process between the plurality of parallel cell groups E1 to E8. In the equalizing process by discharging, control is basically performed so as to match the capacities of other parallel cell groups to the capacity of the parallel cell group having the smallest capacity among the plurality of parallel cell groups E1 to E8.

As described above, the equalizing circuits include discharge resistors Rd1 to Rd8 to discharge the accumulated power, for parallel cell groups E1 to E8, respectively. Controlling circuit 32 determines a discharge duration of each of the other parallel cell groups in order to match the capacities of the other parallel cell groups with the parallel cell group having the smallest capacity. Controlling circuit 32 determines each discharge duration based on the discharge capacity derived from the difference between the capacity of each parallel cell group at the present time and a target capacity of equalization, and a resistance value of the discharge resistor. The resistance values of the plurality of discharge resistors Rd1 to Rd8 are assumed to be the same.

Controlling circuit 32 controls ON/OFF of the discharge switch of each of the other plurality of parallel cell groups based on each of the determined discharge duration. Specifically, controlling circuit 32 transmits to voltage detection circuit 31 a control signal that regulates an ON/OFF timing of each of discharge switches Q1 to Q8, and voltage detection circuit 31 controls ON/OFF of each of the discharge switches Q1 to Q8 based on the received control signal. In the equalizing circuit in which the discharge switch is in an ON state, current flows from the parallel cell group to the discharge resistor, and the capacity of the parallel cell group decreases.

In the present exemplary embodiment, the equalizing process is used to detect a parallel cell group including a cell in which an open failure has occurred. Specifically, in the equalizing process, the parallel cell group is discharged for a predetermined duration, a deviation between a voltage before discharge and a voltage after discharge is calculated, and determines whether or not an abnormality has occurred in the parallel cell group based on the deviation. In the parallel cell group including the cell in which the open failure has occurred, the capacity significantly decreases. For example, if one cell included in the four-parallel cell group has the open failure, the capacity of the parallel cell group is reduced by 25%, and the discharge duration until the target capacity is reached becomes shorter by 25% than normal. For example, if one cell included in the three-parallel cell group has the open failure, the capacity of the parallel cell group is reduced by 33%, and the discharge duration until the target capacity is reached becomes shorter by 33% than normal. For example, if one cell included in the two-parallel cell group has the open failure, the capacity of the parallel cell group is reduced by 50%, and the discharge duration until the target capacity is reached becomes shorter by 50% than normal.

Hereinafter, a method of detecting an abnormal power storage cell group using the equalizing process is described with reference to specific examples. For the reason of simplification, the following specific example is described by taking an example of a two-parallel four-series power storage module.

Figure 2:
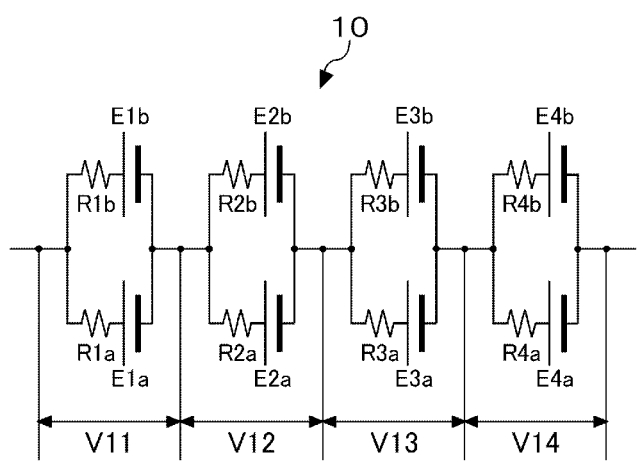
FIG. 2 is a diagram showing a configuration of a two-parallel four-series power storage module.

FIG. 2 is a diagram showing a configuration of two-parallel four-series power storage module 10. First parallel cell group E1 shown in FIG. 2 is constituted of a parallel circuit of first-first parallel cell E1$a$ and first-second parallel cell E1$b$, and first-first parallel cell E1$a$ has first-first internal resistance R1$a$, and first-second parallel cell E1$b$ has first-second internal resistance R1$b$.

Combined resistance R0 of first parallel cell group E1 is calculated by the following (Formula 1).

$$R0 = R1a \times R1b / (R1a + R1b) \quad \text{(Formula 1)}$$

For example, when R1$a$ is 0.001 [Ω] and R1$b$ is 0.001 [Ω], combined resistance R0 of first parallel cell group E1 is 0.0005 [Ω]. Here, when the open failure occurs in first-second parallel cell E1$b$ due to activation of the CID, internal resistance R1$b$ of first-second parallel cell E1$b$ seen from both ends of first parallel cell group E1 rapidly increases. For example, when R1$b$ rises to 1000000 [Ω], combined resistance R0 of first parallel cell group E1 becomes 0.001 [Ω].

As shown above, even if the open failure occurs in one cell included in the parallel cell group, fluctuation of combined resistance R0 is small, and when the fluctuation of combined resistance R0 is detected by voltage, the current needs to be applied for a long time.

Additionally, if the open failure occurs in first-second parallel cell E1$b$ due to bus bar disconnection, wiring resistance of first-second parallel cell E1$b$ seen from both ends of first parallel cell group E1 rapidly increases. Even when the resistance increases due to the loose contact as described above, the fluctuation of combined resistance R0 becomes small. The above considerations also apply to second parallel cell group E2 to fourth parallel cell group E4, similarly to first parallel cell group E1.

Figure 3:
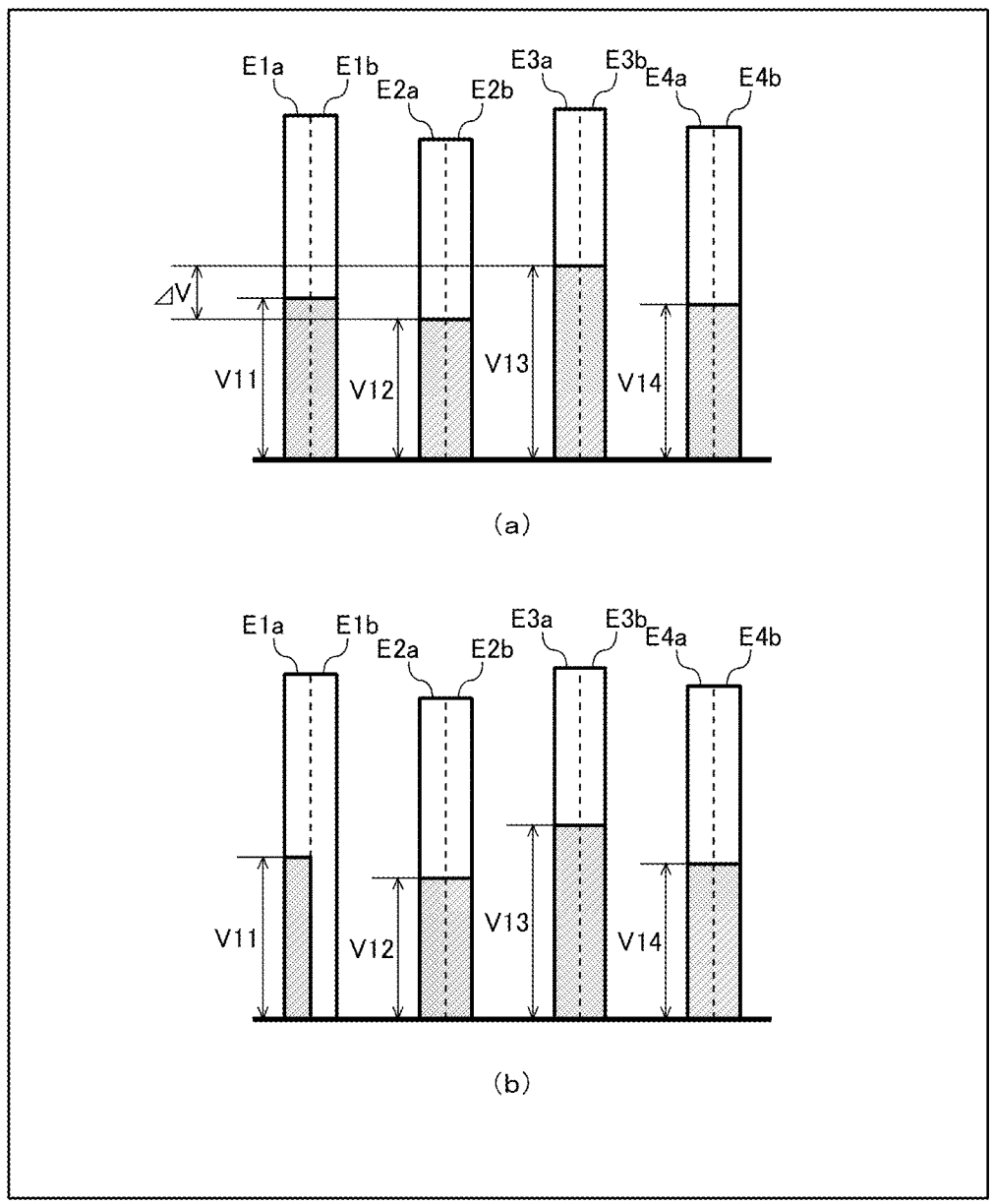
FIGS. 3(a) and 3(b) are diagrams showing an example of variation in capacity of the two-parallel four-series power storage module of FIG. 2.

FIGS. 3($a$) and 3($b$) are diagrams showing an example of variation in capacity of two-parallel four-series power storage module 10 of FIG. 2. A length of each bar indicates a full charge capacity (degree of degradation) at the present time of each parallel cell group. In FIGS. 3($a$) and 3($b$), first voltage V11 indicates the OCV of first parallel cell group E1, second voltage V12 indicates the OCV of second parallel cell group E2, third voltage V13 indicates the OCV of third parallel cell group E3, and fourth voltage V14 indicates the OCV of fourth parallel cell group E4, respectively.

Controlling circuit 32 executes the equalizing process when, for example, a voltage difference ΔV between the lowest OCV of a parallel cell group (second parallel cell group E2 in FIG. 3($a$)) and the highest OCV of a parallel cell group (third parallel cell group E3 in FIG. 3($a$)), is increased more than or equal to a predetermined value. FIG. 3($a$) shows a normal state in which there is no parallel cell group with occurrence of the open failure, and FIG. 3($b$) shows an abnormal state in which there is a parallel cell group with occurrence of the open fault. In FIG. 3($b$), the open failure has occurred in first-second parallel cell E1$b$ included in first parallel cell group E1.

Figure 4:
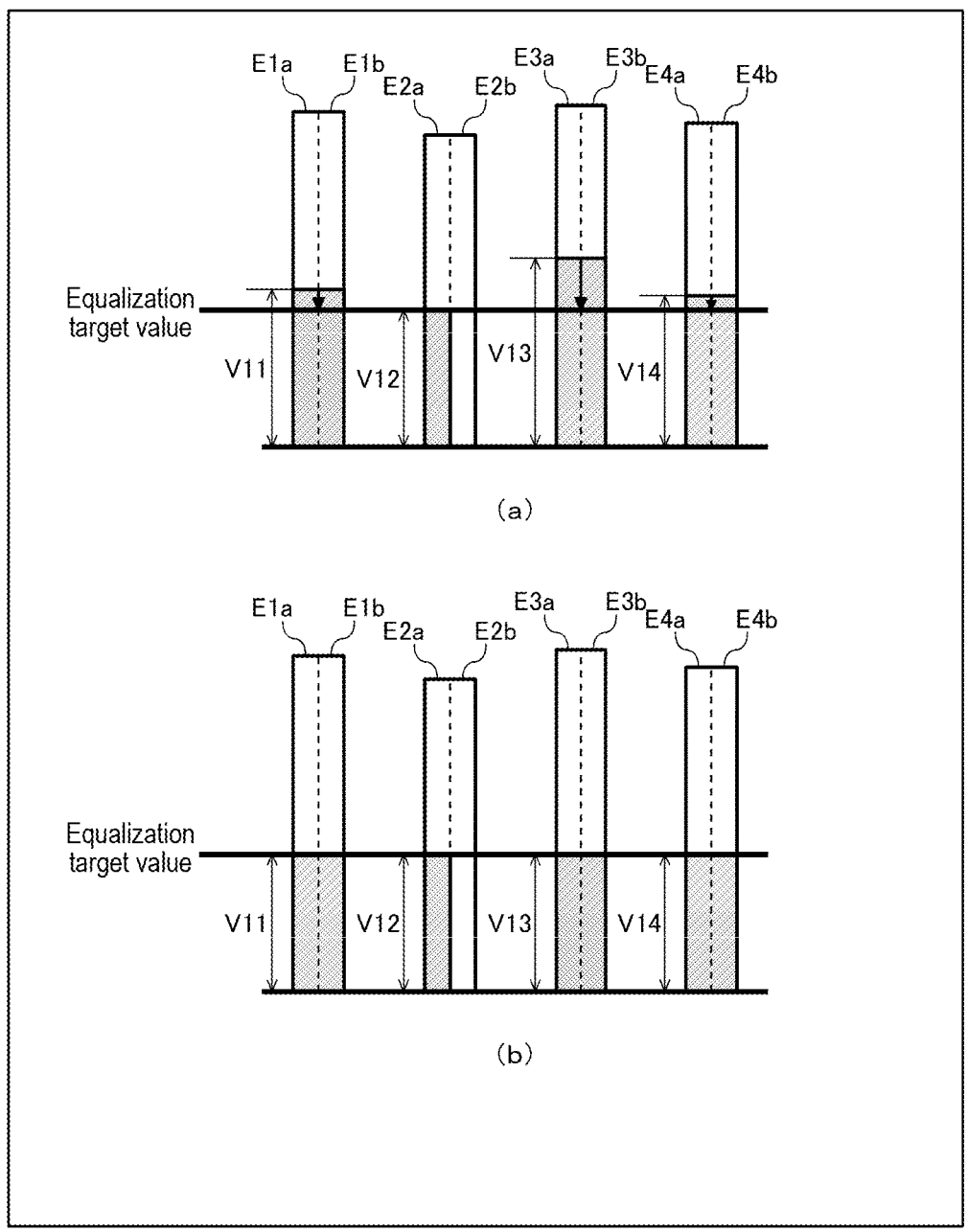
FIGS. 4(a) and 4(b) are diagrams showing an example of an equalizing process.

FIGS. 4($a$) and 4($b$) are diagrams showing an example of the equalizing process. FIG. 4($a$) shows capacities of first parallel cell group E1 to fourth parallel cell group E4 before the equalizing process, and FIG. 4($b$) shows capacities of first parallel cell group E1 to fourth parallel cell group E4 after the equalizing process. In FIG. 4($a$), a parallel cell group having the lowest OCV among first parallel cell group E1 to fourth parallel cell group E4 is second parallel cell group E2. Controlling circuit 32 sets the OCV of second parallel cell group E2 as a target value of the OCV in the equalizing process. In this case, discharge current flows through first parallel cell group E1, third parallel cell group E3, and fourth parallel cell group E4.

As shown in FIGS. 4($a$) and 4($b$), when second parallel cell group E2 having the lowest OCV includes a cell in which the open failure has occurred, no discharge current flows in second parallel cell group E2. Therefore, a significant voltage change does not occur in second parallel cell group E2, and the abnormality of second parallel cell group E2 cannot be detected from the OCV of second parallel cell group E2.

In the above example, as the equalizing process, an OCV matching method of matching the OCVs of the plurality of parallel cell groups E1 to E4 has been described, however, an SOC matching method, a rechargeable amount matching method, or a dischargeable amount matching method may also be used. In the rechargeable amount matching method and the dischargeable amount matching method, because the target value is calculated by an actual capacity [Ah], an influence of variation in full charge capacity at the present time among the plurality of parallel cell groups can be reduced.

Figure 5:
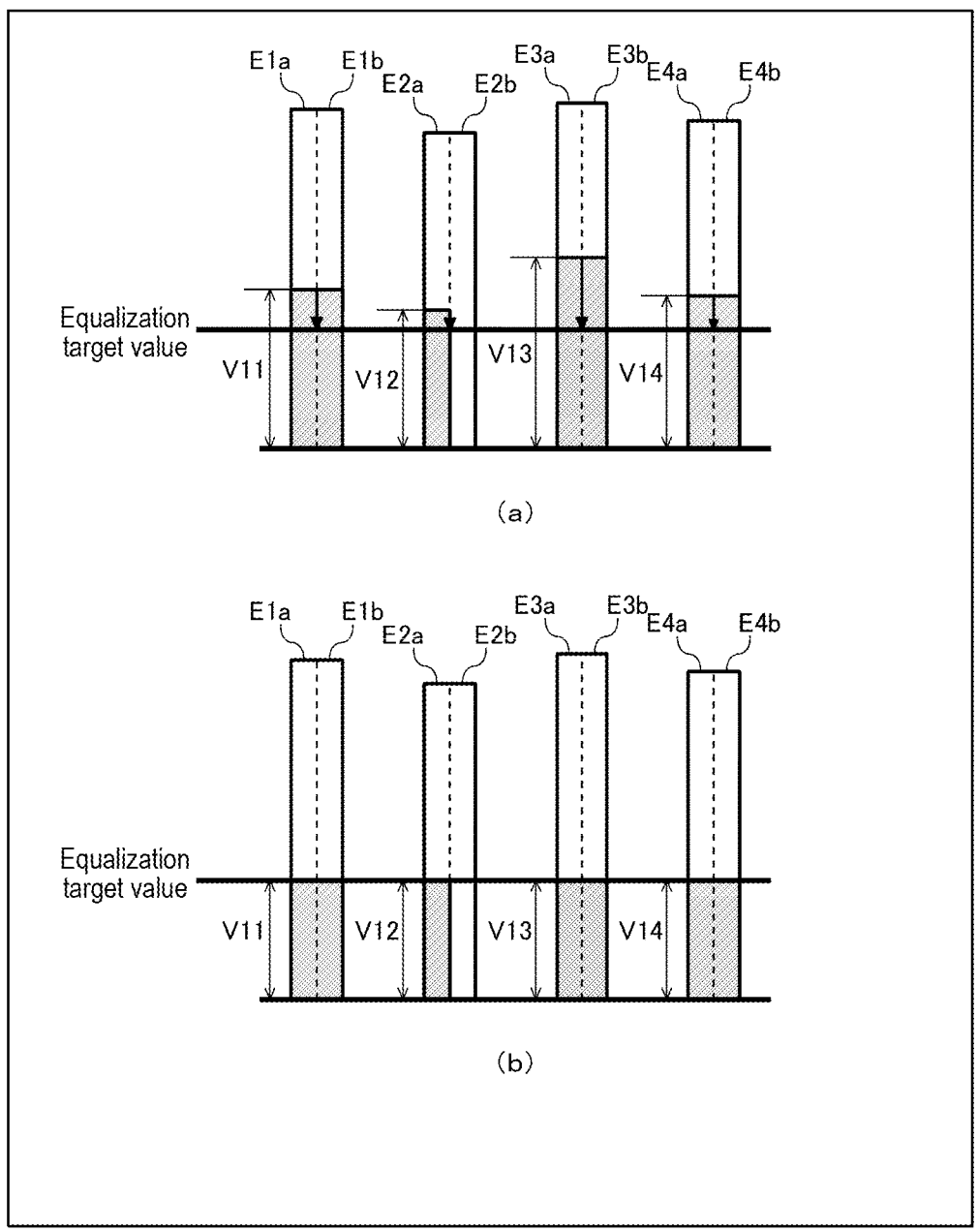
FIGS. 5(a) and 5(b) are diagrams showing another example of the equalizing process.

FIGS. 5($a$) and 5($b$) are diagrams showing another example of the equalizing process. FIG. 5($a$) shows the capacities of first parallel cell group E1 to fourth parallel cell group E4 before the equalizing process, and FIG. 5(b) shows the capacities of first parallel cell group E1 to fourth parallel cell group E4 after the equalizing process. Controlling circuit 32 sets a target value of the OCV in the equalizing process to a value lower than the OCV of second parallel cell group E2 having the lowest OCV by more than or equal to a predetermined value. In this case, the discharge current also flows in second parallel cell group E2.

The predetermined value is set to a value that can secure a discharge duration during which the discharge current that causes a significant voltage change can flow in the parallel cell group. The predetermined value is determined depending on a number of parallel cells included in the parallel cell group and a resistance value of the discharge resistor. As the number of parallel cells decreases and/or the resistance value of the discharge resistor increases, the predetermined value can be set smaller. As the predetermined value is set smaller, a loss of capacity due to the equalizing process can be reduced.

In the example shown in FIGS. 5(a) and 5(b), even if second parallel cell group E2 includes a cell in which the open failure has occurred, the discharge current flows in second parallel cell group E2, and therefore, the abnormality of second parallel cell group E2 can be detected based on the voltage change of second parallel cell group E2 while the discharge current flows.

Figure 6:
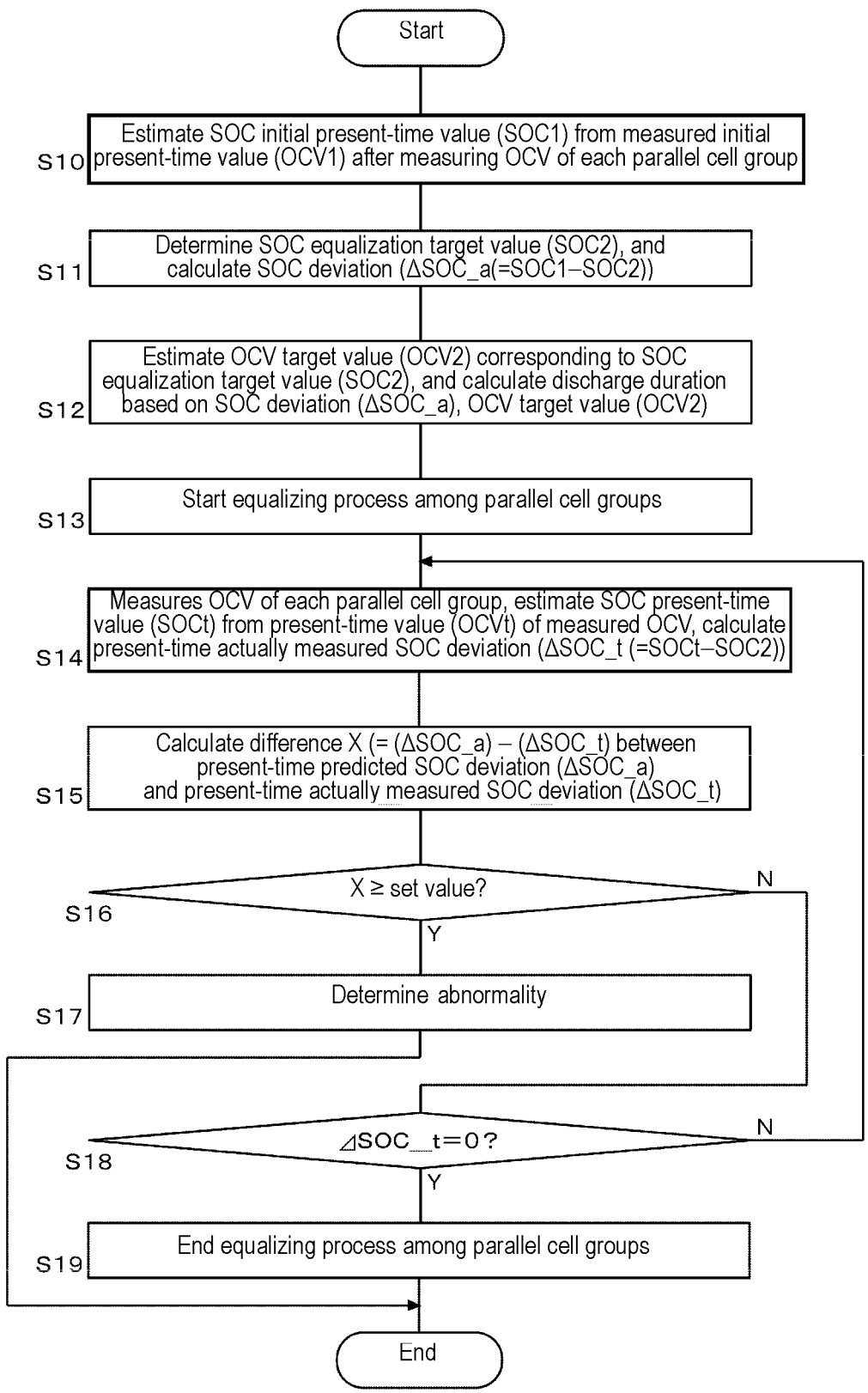
FIG. 6 is a flowchart showing an operation example 1 of the power supply system according to the exemplary embodiment of the present invention.

FIG. 6 is a flowchart showing an operation example 1 of power supply system 1 according to the exemplary embodiment of the present invention. The equalizing process according to the operation example 1 is executed while a vehicle is stopped. Voltage detection circuit 31 measures each OCV of the plurality of parallel cell groups and transmits the OCV to controlling circuit 32. Controlling circuit 32 estimates an SOC initial present-time value (SOC1) of each parallel cell group from an initial present-time value (OCV1) of each measured OCV, based on an SOC-OCV curve (S10).

Figure 7:
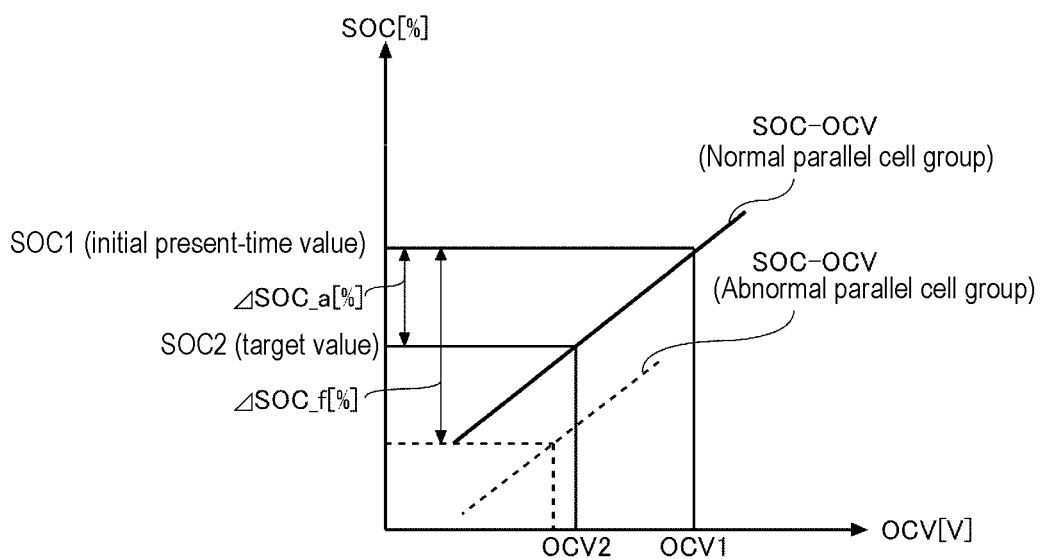
FIG. 7 is a diagram showing an example of a state of charge (SOC)-OCV curve of a normal parallel cell group (solid line) and an SOC-OCV curve of an abnormal parallel cell group including a cell in which an open failure has occurred (dotted line).

FIG. 7 is a diagram showing an example of an SOC-OCV curve of a normal parallel cell group (solid line) and an SOC-OCV curve of an abnormal parallel cell group including a cell in which the open failure has occurred (dotted line). Note that the SOC-OCV curves are drawn as straight lines in FIG. 7 for simplification.

The description returns to the flowchart of FIG. 6. Controlling circuit 32 estimates each SOC of the plurality of parallel cell groups based on each measured OCV of the plurality of parallel cell groups. Controlling circuit 32 determines an SOC equalization target value (SOC2) of the plurality of parallel cell groups based on each SOC of the plurality of parallel cell groups. For example, controlling circuit 32 determines the lowest SOC among the estimated SOCs as the SOC equalization target value. Controlling circuit 32 calculates a SOC deviation ($\Delta$SOC_a) by subtracting the SOC equalization target value (SOC2) from the SOC initial present-time value (SOC1) in each parallel cell group (S11).

Controlling circuit 32 estimates an OCV equalization target value (OCV2) corresponding to the SOC equalization target value (SOC2), and calculates the discharge duration of each parallel cell group based on the following (Formula 2) (S12).

Discharge duration [sec]=Amount of current for
SOC deviation fraction [Ah]/(OCV2[V]×Rd[Ω])

Amount of current for SOC deviation fraction [Ah]=
Rated capacity [Ah]×Normal SOC deviation
($\Delta$SOC)[%]  (Formula 2)

Rd represents the resistance value of the discharge resistor. The normal SOC deviation ($\Delta$SOC) indicates the SOC deviation when the abnormality is assumed not to have occurred in the parallel cell group.

Figure 8:
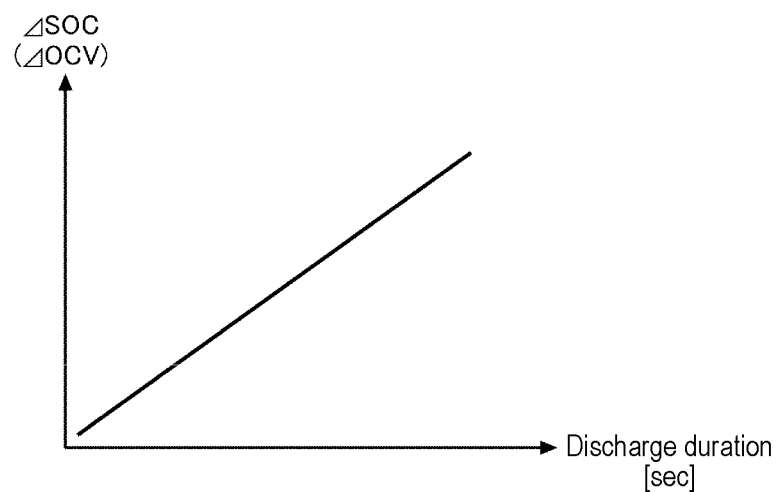
FIG. 8 is a diagram showing a relationship between a discharge duration and an SOC deviation ($\Delta$SOC).

FIG. 8 is a diagram showing a relationship between the discharge duration and the SOC deviation ($\Delta$SOC). As the SOC deviation ($\Delta$SOC) increases, a longer discharge duration is required.

The description returns to the flowchart of FIG. 6. Controlling circuit 32 starts the equalizing process of the plurality of parallel cell groups (S13). Voltage detection circuit 31 periodically (for example, every hour) measures each OCV of the plurality of parallel cell groups, and transmits the OCV to controlling circuit 32. Controlling circuit 32 estimates an SOC present-time value (SOCt) of each parallel cell group from a present-time value (OCVt) measured for each OCV, based on the SOC-OCV curve. Controlling circuit 32 calculates a present-time actually measured SOC deviation ($\Delta$SOC_t) by subtracting the SOC equalization target value (SOC2) from the SOC present-time value (SOCt) in each parallel cell group (S14).

Controlling circuit 32 subtracts the present-time actually measured SOC deviation ($\Delta$SOC_t) from the present-time predicted SOC deviation ($\Delta$SOC_a) estimated based on the initially measured SOC deviation ($\Delta$SOC_a) and the discharge duration up to the present time, and calculates a difference X (=($\Delta$SOC_a)−($\Delta$SOC_t)) (S15). Controlling circuit 32 compares the difference X with a set value (S16). The set value is a set value for determining whether or not the cell in which the open failure has occurred is included, and is set according to the number of cells included in the parallel cell group. For example, the set value is set to 25% when the number of cells included in the parallel cell group is 4, 33% when the number of cells is 3, and 50% when the number of cells is 2.

When a parallel cell group occurs in which the difference X is more than or equal to the set value (Y in S16), controlling circuit 32 determines the parallel cell group as a parallel cell group in which the abnormality has occurred (S17). Controlling circuit 32 notifies a not-shown host system (for example, an ECU on a vehicle side) of the abnormality of the parallel cell group.

When the parallel cell group having the difference X more than or equal to the set value does not occur (N in S16), controlling circuit 32 determines, for each parallel cell group, whether or not the present-time actually measured SOC deviation ($\Delta$SOC_t) has reached zero (S18). Controlling circuit 32 ends the equalizing process for the parallel cell group whose present-time actually measured SOC deviation ($\Delta$SOC_t) has reached zero (Y in S18) (S19). For the parallel cell group whose present-time actually measured SOC deviation ($\Delta$SOC_t) does not reach zero (N in S18), a process proceeds to step S14 and the equalizing process is continued.

As described in FIGS. 4(a) and 4(b), in the equalizing process, the OCV/SOC of the parallel cell group having the lowest OCV/SOC among the OCVs/SOCs of the plurality of parallel cell groups is generally set as the equalization target value. In this case, the discharge current does not flow from the parallel cell group having the lowest OCV/SOC, and the abnormality in the parallel cell group cannot be detected. Therefore, in FIGS. 5(a) and 5(b), the example has been described in which the equalization target value is set lower than the lowest OCV/SOC. Hereinafter, another method is described.

Figure 9:
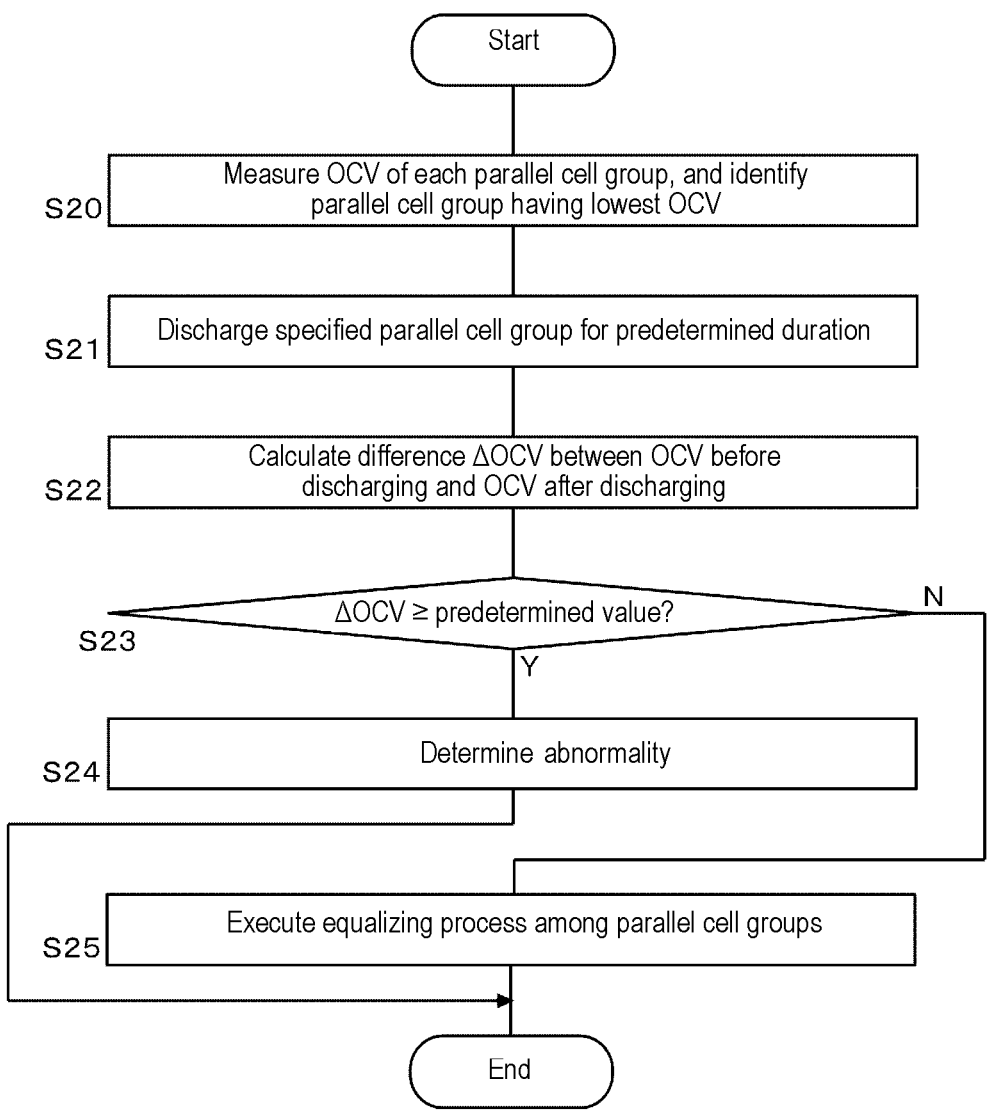
FIG. 9 is a flowchart showing an operation example 2 of the power supply system according to the exemplary embodiment of the present invention.

FIG. 9 is a flowchart showing an operation example 2 of power supply system 1 according to the exemplary embodiment of the present invention. The equalizing process according to the operation example 2 is also executed while the vehicle is stopped. Voltage detection circuit 31 measures each OCV of the plurality of parallel cell groups and transmits the OCV to controlling circuit 32. Controlling circuit 32 identifies the parallel cell group having the lowest OCV among the measured OCVs (S20). Controlling circuit 32 discharges the specified parallel cell group for a predetermined duration (S21).

The predetermined duration is set to a duration during which a significant voltage change can be generated in the parallel cell group. The predetermined duration is determined depending on the number of parallel cells included in the parallel cell group and the resistance value of the discharge resistor. As the number of parallel cells decreases and/or the resistance value of the discharge resistor increases, the predetermined duration can be set shorter. As the predetermined value is set smaller, a loss of capacity due to the discharging can be reduced.

Voltage detection circuit 31 measures the OCV of the parallel cell group after the predetermined duration has passed, and transmits the OCV to controlling circuit 32. Controlling circuit 32 calculates a difference ΔOCV between the OCV before the discharging and the OCV after the discharging of the parallel cell group (S22). Controlling circuit 32 compares the calculated difference ΔOCV with a predetermined value (S23). The predetermined value is determined depending on the number of parallel cells included in the parallel cell group, the resistance value of the discharge resistor, and the discharge duration.

When the difference ΔOCV is more than or equal to the predetermined value (Y in S23), controlling circuit 32 determines the parallel cell group as a parallel cell group in which the abnormality has occurred (S24). Controlling circuit 32 notifies the not-shown host system of the abnormality of the parallel cell group. When the difference ΔOCV is less than the predetermined value (N in S23), controlling circuit 32 executes the equalizing process between the plurality of parallel cell groups (S25). The equalization target value is set to the OCV/SOC after the discharging of the parallel cell group having the lowest OCV.

Figure 10:
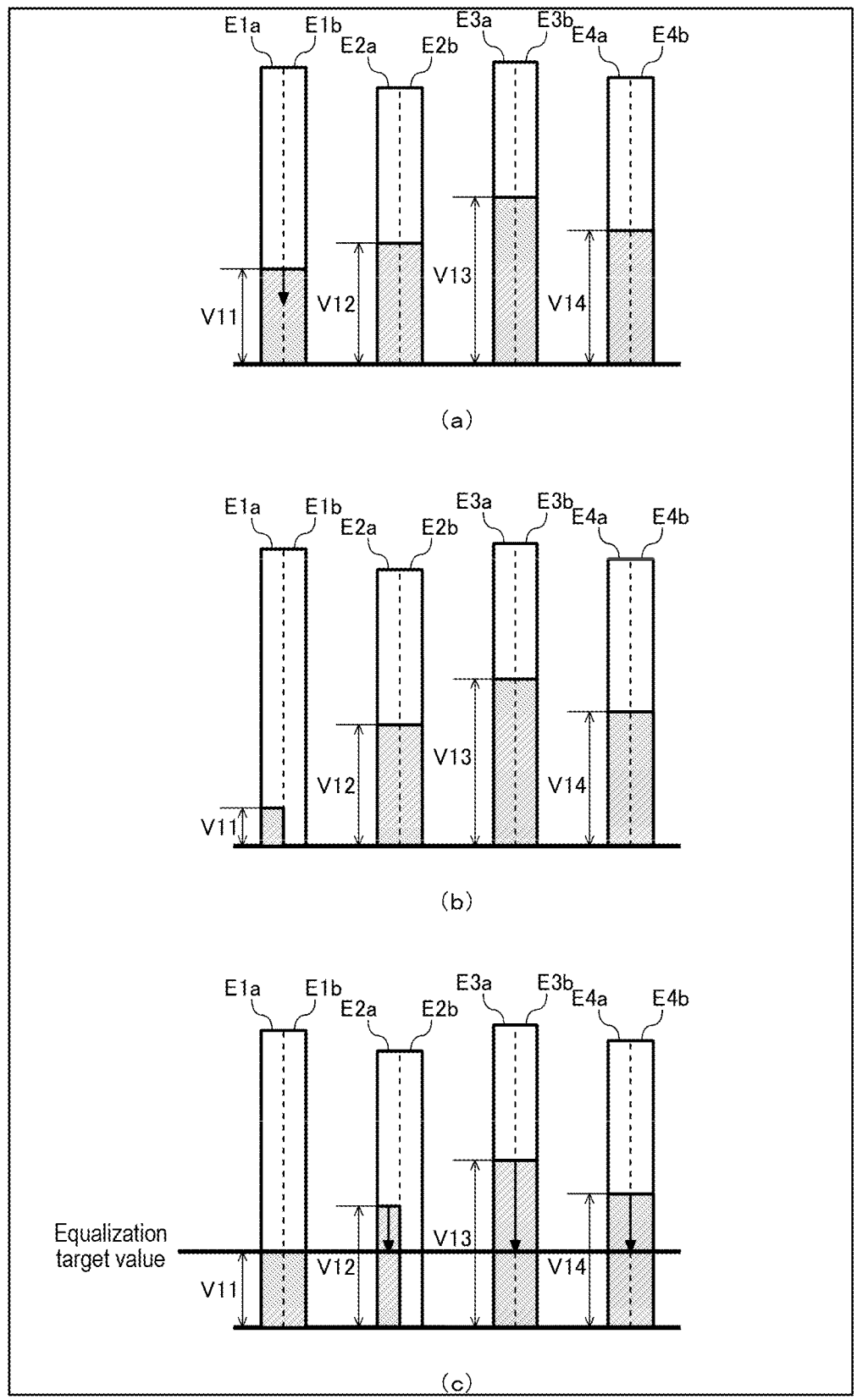
FIGS. 10(a) to 10(c) are diagrams for explaining an example of the equalizing process according to the operation example 2.

FIGS. 10(a) to 10(c) are diagrams for explaining an example of the equalizing process according to the operation example 2. FIG. 10(a) shows the capacities of first parallel cell group E1 to fourth parallel cell group E4 before the equalizing process. First, only first parallel cell group E1 having the lowest OCV is discharged for a predetermined duration. FIGS. 10(b) and 10(c) show the capacities of first parallel cell group E1 to fourth parallel cell group E4 after the discharging of first parallel cell group E1. FIG. 10(b) shows a case in which first parallel cell group E1 includes a cell in which the open failure has occurred, and FIG. 10(c) shows a case in which first parallel cell group E1 does not include a cell in which the open failure has occurred.

As shown in FIG. 10(b), if first parallel cell group E1 includes the cell in which the open failure has occurred, the OCV of first parallel cell group E1 sharply decreases. As a result, controlling circuit 32 can detect the abnormality in first parallel cell group E1.

As shown in FIG. 10(c), if first parallel cell group E1 does not include the cell in which the open failure has occurred, the OCV of first parallel cell group E1 decreases slowly and controlling circuit 32 determines that first parallel cell group E1 is normal. Controlling circuit 32 uses the OCV/SOC of first parallel cell group E1 as the equalization target value and executes the equalizing process of second parallel cell group E2 to fourth parallel cell group E4. FIG. 10(c) shows a case in which second parallel cell group E2 includes a cell in which the open failure has occurred, and in the process of the equalizing process, controlling circuit 32 can detect the abnormality of second parallel cell group E2.

Figure 11:
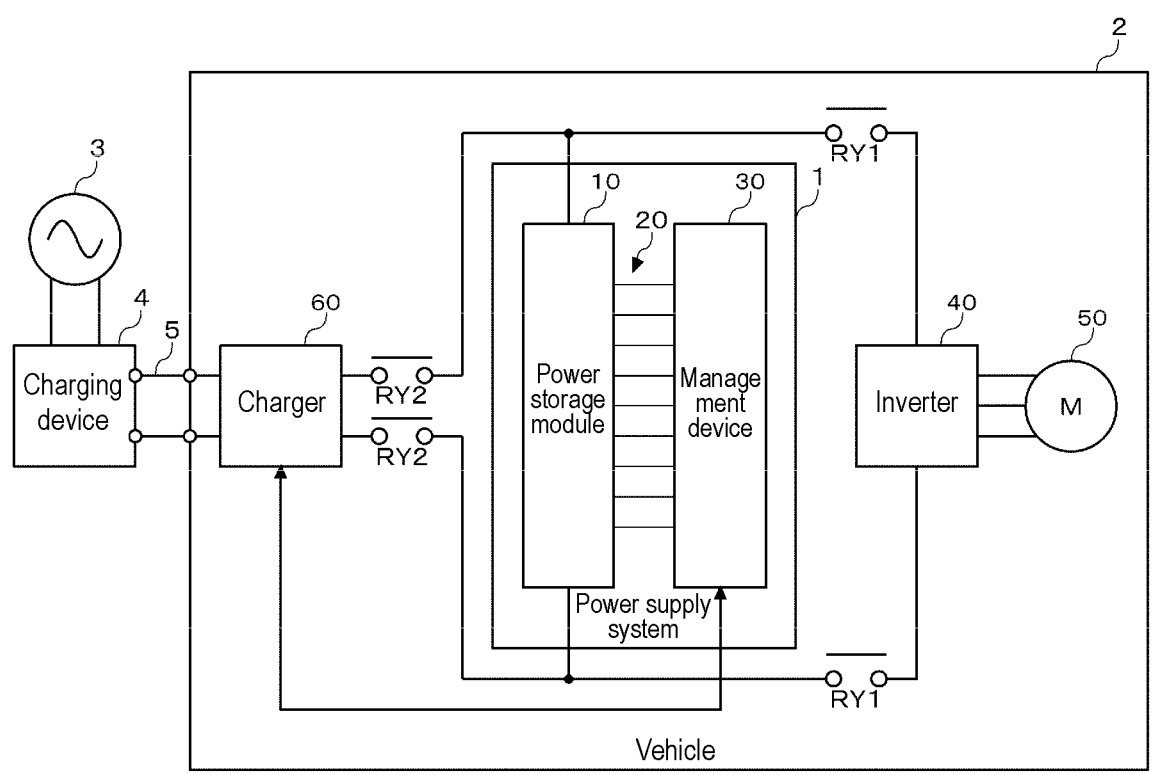
FIG. 11 is a diagram for explaining a vehicle equipped with the power supply system according to the exemplary embodiment of the present invention.

FIG. 11 is a diagram for explaining vehicle 2 equipped with power supply system 1 according to the exemplary embodiment of the present invention. In the present exemplary embodiment, vehicle 2 is an electric vehicle (EV) that can be charged from a commercial power system (hereinafter simply referred to as system 3).

Vehicle 2 includes power supply system 1, inverter 40, motor 50, charger 60, first relays RY1 and second relays RY2. Power supply system 1 includes power storage module 10, harness connector 20, and management device 30, as described above.

At the time of power running, inverter 40 converts direct current (DC) power supplied from power storage module 10 into alternating current (AC) power and supplies the AC power to motor 50. At the time of regeneration, the AC power supplied from motor 50 is converted into the DC power and is supplied to power storage module 10. At the time of power running, motor 50 rotates according to the AC power supplied from inverter 40. At the time of regeneration, rotational energy due to deceleration is converted into the AC power and is supplied to inverter 40.

First relays RY1 are inserted between wiring that connects power storage module 10 and inverter 40. Management device 30 controls first relays RY1 to an ON state (closed state) during traveling, and electrically connects power storage module 10 and a power system. Management device 30 controls first relays RY1 to an OFF state (open state) basically when the vehicle is not traveling, and electrically disconnects power storage module 10 from the power system.

Power storage module 10 can be charged by charging device 4 installed outside vehicle 2. Charging device 4 and vehicle 2 are connected by charging cable 5. In vehicle 2, a power feed line connected to charging cable 5 is connected to charger 60. Charger 60 is connected to power storage module 10 via second relays RY2, and charges power storage module 10 with power supplied from charging device 4. When management device 30 detects overvoltage, undervoltage, overcurrent, or temperature abnormality of power storage module 10, management device 30 turns off first relays RY1 and second relays RY2 to protect power storage module 10.

Charging device 4 is installed at home, a car dealer, a service area, a commercial facility, a public facility, or the like. Charging device 4 is connected to system 3 and supplies AC 100/200 V single-phase AC power to vehicle 2 via charging cable 5. In the case of general power storage module 10, when power storage module 10 is charged with a current of more than or equal to 15 A, power storage module 10 can be fully charged within several hours. When power storage module 10 is charged with a current of less than or equal to 7 A, it takes more than or equal to 12 hours to be fully charged. When power storage module 10 is charged at a low current of AC 100 V, charging device 4 may not be provided and charging cable 5 may be directly inserted into a household outlet.

If there is a parallel cell group in which the open failure has occurred, the parallel cell group reaches the full charge capacity earliest by charging from charging device 4. Controlling circuit 32 can detect the parallel cell group including a cell in which the open failure has occurred by monitoring the SOC deviation of the plurality of parallel cell groups that are being charged. During charging, the SOC of the parallel cell group including the cell in which the open failure has occurred deviates from the SOCs of other normal parallel cell groups. Controlling circuit 32 determines that, for example, a parallel cell group whose deviation of SOC from an average SOC of the plurality of parallel cell groups being charged has become more than or equal to a predetermined value, as the abnormal parallel cell group.

Figure 12:
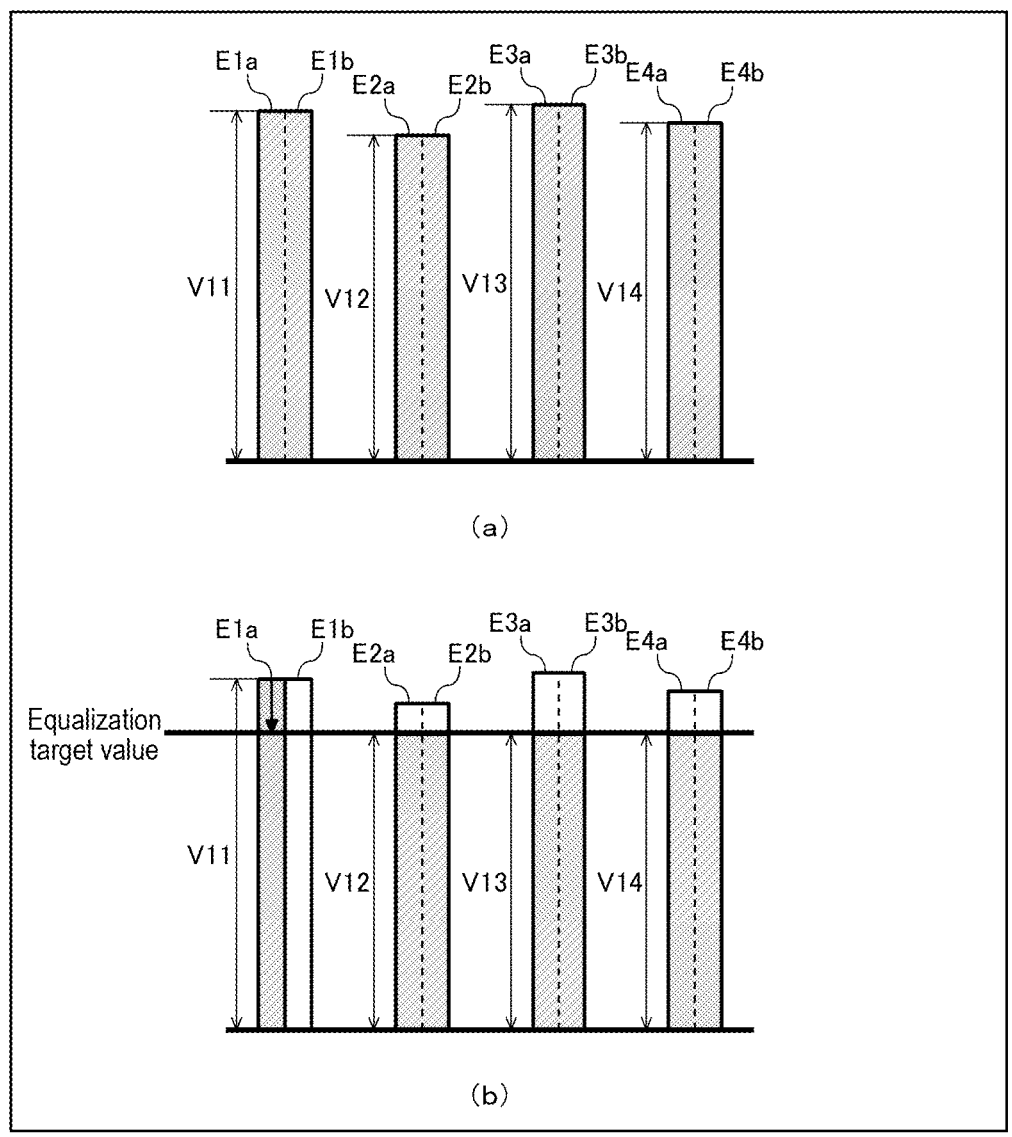
FIGS. 12(a) and 12(b) are diagrams showing an example of capacities during external charging.

FIGS. 12(*a*) and 12(*b*) are diagrams showing an example of capacities during external charging. FIG. 12(*a*) shows the capacities of first parallel cell group E1 to fourth parallel cell group E4 after the external charging is finished, in the case that there is no abnormal parallel cell group. On the other hand, if there is an abnormal parallel cell group, before first parallel cell group E1 to fourth parallel cell group E4 reach the full charge capacities, the deviation between the SOC of the abnormal parallel cell group and the SOCs of other parallel cell groups becomes large, and the abnormal parallel cell group is detected.

However, when first parallel cell group E1 to fourth parallel cell group E4 are charged from positions close to the full charge capacities, the abnormal parallel cell group may reach the full charge capacity before the deviation of the SOCs becomes large. Hereinafter, a control example for handling with the above case is described.

Controlling circuit 32 starts the equalizing process of the plurality of parallel cell groups when one of the plurality of parallel cell groups reaches the full charge capacity during the external charging. As the equalization target value, the OCV/SOC of the parallel cell group having the lowest OCV/SOC at that time is used.

FIG. 12(*b*) shows the capacities of first parallel cell group E1 to fourth parallel cell group E4 when the open failure has occurred in first-second parallel cell E1*b*. In this example, first parallel cell group E1 reaches the full charge capacity first. Controlling circuit 32 starts the equalizing process when first parallel cell group E1 reaches the full charge capacity. Thereby, the abnormality of first parallel cell group E1 can be detected. If there is no abnormal parallel cell group, positions of the capacities of first parallel cell group E1 to fourth parallel cell group E4 are almost at the same level, and the loss due to the equalizing process is small.

As described above, according to the present exemplary embodiment, the SOC of each parallel cell group is estimated only with the discharge duration and the voltage measurement using the equalizing circuit including the fixed resistors. No current value is required. Therefore, the open failure of the cell can be detected when the vehicle is parked, and the risk that the vehicle suddenly stops due to the abnormality of power supply system 1 during traveling can be reduced. Further, because a current integration value is not used, there is no influence of current variations or phase shifts, and highly accurate detection is possible. Moreover, because a failure detection process is executed concurrently with the equalizing process, efficient failure detection is possible. Still further, by passing the current through the discharge resistors of the equalizing circuit, the voltage change can be accelerated, and the abnormality in the cell can be detected in a short time.

The present invention has been described above based on the exemplary embodiment. It is understood by the person of ordinary skill in the art that the exemplary embodiment is exemplifications, that various modifications can be made to the combinations of their respective configuration elements and respective processing processes, and that such modifications are also within the scope of the present invention.

In the above-described exemplary embodiment, the example has been explained in which it is determined whether or not the abnormality has occurred in the parallel cell group based on the difference between the present-time predicted SOC deviation ($\Delta SOC\_a$) and the present-time actually measured SOC deviation ($\Delta SOC$ J). In this respect, it may be determined whether or not the abnormality has occurred in the parallel cell group based on a duration (=time) until the OCV/SOC of the parallel cell group being discharged reaches the target value.

In the above-described exemplary embodiment, the equalizing circuit using a discharge circuit (passive mode) has been described. In this respect, there is also an equalizing circuit using a charging circuit (active mode). In this case, the "discharge duration" in the above-described embodiment is replaced by a "charging duration". In the case of charging, as in the case of discharging, the voltage change in the abnormal parallel cell group becomes larger than the voltage change in the normal parallel cell group.

The exemplary embodiment may be specified by the following items.

[Item 1]

Management device (30) manages power storage module (10) configured by connecting in series a plurality of parallel cell groups in which a plurality of cells are connected in parallel, management device (30) including:

voltage detection circuit (31) that detects a voltage of each of the plurality of parallel cell groups (E1 to E8) connected in series;

a plurality of equalizing circuits connected in parallel to the plurality of parallel cell groups (E1 to E8), respectively; and controlling circuit (32) that controls the plurality of equalizing circuits based on the voltage detected by voltage detection circuit (31) and executes an equalizing process.

In management device (30), controlling circuit (32) determines whether or not an abnormal cell is included in each of the plurality of parallel cell groups based on a voltage change of each of the plurality of parallel cell groups during discharging to each of the plurality of equalizing circuits or charging from each of the plurality of equalizing circuits.

With this configuration, the abnormal parallel cell group can be detected with high accuracy in a short time without using the current value.

[Item 2]

In management device (30) according to item 1, controlling circuit (32) detects any of the plurality of parallel cell groups including the abnormal cell based on the voltage change of each of the plurality of parallel cell groups (E1 to E8) during the equalizing process between the plurality of parallel cell groups (E1 to E8).

With this configuration, an abnormality detection process of the parallel cell group can be executed concurrently with the equalizing process.

[Item 3]

In management device (30) according to item 1 or 2, the plurality of equalizing circuits include discharge resistors (Rd1 to Rd8), and controlling circuit (32) executes the equalizing process using, as a target value, an SOC or OCV that is lower than the SOC or OCV of one of the plurality of parallel cell groups having the SOC or OCV that is the lowest among the plurality of parallel cell groups (E1 to E8).

With this configuration, even if there is the abnormality in the parallel cell group having the lowest SOC or OCV, the abnormality of the parallel cell group can be detected.

[Item 4]

In management device (30) according to item 1 or 2, the plurality of equalizing circuits include discharge resistors (Rd1 to Rd8), and controlling circuit (32) performs discharging for a predetermined duration from one of the plurality of parallel cell groups having an SOC or OCV that is the lowest among the plurality of parallel cell groups (E1 to E8) to one of the plurality of equalizing circuits connected in parallel to the one of the plurality of parallel cell groups, and based on the voltage change of the one of the plurality of parallel cell groups, determines whether or not the one of the plurality of parallel cell group includes an abnormal cell, and when the abnormal cell is not included in the one of the plurality of parallel cell groups, starts the equalizing process between the plurality of parallel cell groups (E1 to E8).

With this configuration, even if there is the abnormality in the parallel cell group having the lowest SOC or OCV, the abnormality of the parallel cell group can be detected.

[Item 5]

In management device (30) according to any one of items 1 to 4, the plurality of equalizing circuits include discharge resistors (Rd1 to Rd8), and controlling circuit (32) determines that, when an SOC deviation per predetermined duration of any of the plurality of parallel cell groups during discharging to the discharge resistors (Rd1 to Rd8) is larger than a predicted value by more than or equal to a set value, an abnormal cell is included in the any of the plurality of parallel cell groups.

With this configuration, the abnormality of the parallel cell group can be detected before the equalization target value is reached.

[Item 6]

Power supply system (1) includes:

power storage module (10) configured by connecting in series a plurality of parallel cell groups (E1 to E8) in which a plurality of cells are connected in parallel; and management device (30) according to any one of items 1 to 5, configured to manage the power storage module (10).

With this configuration, the abnormal parallel cell group can be detected with high accuracy in a short time without using the current value.

REFERENCE MARKS IN THE DRAWINGS 1 power supply system
10 power storage module
E1 to E8 parallel cell group
R1 to R8 internal resistance
L1 to L9 voltage detection line
20 harness connector
30 management device
Rd1 to Rd8 discharge resistor
Q1 to Q8 discharge switch
C1 to C8 capacitor
Rf1 to Rf9 resistor
31 voltage detection circuit
32 controlling circuit
2 vehicle
RY1 first relay
3 system
RY2 second relay
4 charging device
5 charging cable
40 inverter
50 motor
60 charger

The invention claimed is:

1. A management device that manages a power storage module configured by connecting in series a plurality of parallel cell groups in each of which a plurality of cells are connected in parallel, the management device comprising:

a voltage detection circuit that detects a voltage of each of the plurality of parallel cell groups connected in series;

a plurality of equalizing circuits connected in parallel to the plurality of parallel cell groups, respectively; and a controlling circuit that controls the plurality of equalizing circuits based on the voltage detected by the voltage detection circuit and executes an equalizing process, wherein the controlling circuit determines whether or not an abnormal cell that is a cell having an open failure or a cell electrically disconnected from a remainder of the plurality of parallel cell groups is included in each of the plurality of parallel cell groups based on a voltage change of each of the plurality of parallel cell groups, the voltage change being a change in voltage of an individual parallel cell group before and after either discharge to, or charge from, a corresponding one of the plurality of equalizing circuits.

2. The management device according to claim 1, wherein the controlling circuit detects any of the plurality of parallel cell groups including the abnormal cell based on the voltage change of each of the plurality of parallel cell groups during the equalizing process between the plurality of parallel cell groups.

3. The management device according to claim 1,
wherein the plurality of equalizing circuits include discharge resistors, and
wherein the controlling circuit executes the equalizing process using, as a target value, a state of charge (SOC) or open circuit voltage (OCV) that is lower than the SOC or OCV of one of the plurality of parallel cell groups having the SOC or OCV that is a lowest among the plurality of parallel cell groups.

4. The management device according to claim 1,
wherein the plurality of equalizing circuits include discharge resistors, and
wherein the controlling circuit performs discharging for a predetermined duration from one of the plurality of parallel cell groups having an SOC or OCV that is a lowest among the plurality of parallel cell groups to one of the plurality of equalizing circuits connected in parallel to the one of the plurality of parallel cell groups, and based on the voltage change of the one of the plurality of parallel cell groups, determines whether or not the one of the plurality of parallel cell group includes an abnormal cell, and when the abnormal cell is not included in the one of the plurality of parallel cell groups, starts the equalizing process between the plurality of parallel cell groups.

5. The management device according to claim 1,
wherein the plurality of equalizing circuits include the discharge resistors, and
wherein the controlling circuit determines that, when an SOC deviation per predetermined duration of any of the plurality of parallel cell groups during discharging to the discharge resistors is larger than a predicted value by more than or equal to a set value, an abnormal cell is included in the any of the plurality of parallel cell groups.

6. A power supply system comprising:
a power storage module configured by connecting in series a plurality of parallel cell groups in which a plurality of cells are connected in parallel; and
the management device according to claim 1, configured to manage the power storage module.

* * * * *